(12) United States Patent
Che (10) Patent No.: US 10,801,777 B2
(45) Date of Patent: Oct. 13, 2020

(54) BAKING DEVICE

(71) Applicants: HKC CORPORATION LIMITED, Shenzhen, Guangdong (CN); CHONGQING HKC OPTOELECTRONICS TECHNOLOGY CO., LTD., Chongqing (CN)

(72) Inventor: Lun Che, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 10 days.

(21) Appl. No.: 16/317,593

(22) PCT Filed: Nov. 1, 2018

(86) PCT No.: PCT/CN2018/113468
§ 371 (c)(1),
(2) Date: Jan. 14, 2019

(87) PCT Pub. No.: WO2020/062428
PCT Pub. Date: Apr. 2, 2020

(65) Prior Publication Data
US 2020/0103169 A1    Apr. 2, 2020

(30) Foreign Application Priority Data
Sep. 30, 2018 (CN) .......................... 2018 1 1155852

(51) Int. Cl.
*F26B 25/00* (2006.01)
*G03F 7/16* (2006.01)
(Continued)

(52) U.S. Cl.
CPC .............. *F26B 25/003* (2013.01); *F26B 3/04* (2013.01); *F26B 11/00* (2013.01); *F26B 25/006* (2013.01);
(Continued)

(58) Field of Classification Search
CPC ...... F26B 25/003; F26B 25/006; F26B 25/12; F26B 25/16; F26B 3/03; G03F 7/168
(Continued)

(56) References Cited

U.S. PATENT DOCUMENTS 1,370,222 A * 3/1921 Pemberton .............. F26B 21/08
34/74
4,616,594 A * 10/1986 Itho ......................... B05B 16/95
118/326
(Continued)

FOREIGN PATENT DOCUMENTS

CN    201710163 U    1/2011
CN    105147129 A    12/2015
(Continued)

OTHER PUBLICATIONS

Qian Geng, the ISA written comments, Mar. 2019, CN.

*Primary Examiner* — Stephen M Gravini (57) ABSTRACT

A baking device including a body having an access port, through which a baked object is allowed to be placed into or taken out of the body. The access door is mounted at the body and is configured to open and close the access port. An inner side surface of the access door defines therein grooves configured to receive condensate.

19 Claims, 4 Drawing Sheets

(51) Int. Cl.
*F26B 3/04* (2006.01)
*F26B 25/16* (2006.01)
*F26B 25/12* (2006.01)
*F26B 11/00* (2006.01)

(52) U.S. Cl.
CPC ............ *F26B 25/008* (2013.01); *F26B 25/12* (2013.01); *F26B 25/16* (2013.01); *G03F 7/168* (2013.01)

(58) Field of Classification Search
USPC .......................................................... 34/202
See application file for complete search history.

(56) References Cited

U.S. PATENT DOCUMENTS

| | | | | | |
|---|---|---|---|---|---|
| 5,165,969 | A | * | 11/1992 | Barlett | F26B 23/022 427/483 |
| 5,393,348 | A | * | 2/1995 | Morris | B05B 7/0884 118/668 |
| 5,535,525 | A | * | 7/1996 | Gardner | F26B 21/145 134/105 |
| 5,608,974 | A | * | 3/1997 | Tanaka | F26B 5/04 118/58 |
| 5,950,328 | A | * | 9/1999 | Ichiko | H01L 21/67034 34/364 |
| 5,956,859 | A | * | 9/1999 | Matsumoto | H01L 21/67034 34/74 |
| 6,010,562 | A | * | 1/2000 | Flynn | B01D 53/0415 96/125 |
| 6,108,928 | A | * | 8/2000 | Park | H01L 21/67034 34/77 |
| 6,158,141 | A | * | 12/2000 | Asada | H01L 21/67034 134/25.4 |
| 6,883,248 | B2 | * | 4/2005 | Ko | H01L 21/67034 34/78 |
| 7,131,217 | B2 | * | 11/2006 | Kim | H01L 21/67034 34/630 |
| 7,437,834 | B2 | * | 10/2008 | Nakatsukasa | H01L 21/02052 34/381 |
| 7,581,335 | B2 | * | 9/2009 | Tanaka | H01L 21/67028 118/900 |
| 8,393,091 | B2 | * | 3/2013 | Kawamoto | H01L 21/02057 134/21 |
| 8,505,212 | B2 | * | 8/2013 | Slack | F26B 21/14 219/687 |
| 9,015,960 | B2 | * | 4/2015 | Hopkin | F26B 9/02 34/417 |
| 9,275,847 | B2 | * | 3/2016 | Jung | H01L 21/00 |
| 9,964,358 | B2 | * | 5/2018 | Matsushita | H01L 21/67115 |
| 10,197,333 | B2 | * | 2/2019 | Kim | F26B 21/145 |

FOREIGN PATENT DOCUMENTS

| | | |
|---|---|---|
| CN | 206007026 U | 3/2017 |
| EP | 3006832 A1 | 4/2016 |
| WO | WO2018076179 A1 | 5/2018 |

* cited by examiner

BAKING DEVICE

CROSS-REFERENCE TO RELATED APPLICATIONS

This application is the International Application No. PCT/CN2018/113468 for entry into US national phase with an international filing date of Nov. 1, 2018, designating US, now pending, and claims priority to Chinese Patent Application No. 201811155852.2, filed on Sep. 30, 2018, the content of which is incorporated herein by reference in its entirety.

BACKGROUND OF THE INVENTION

Field of the Invention

The present application relates to the technical field of baking, and more particularly to a baking device.

Description of Related Art

In manufacturing procedure of a color filter, a substrate, after being coated with a photoresist material by a coater, needs to be baked using an oven to dry the photoresist material by removing a part of the solvent therefrom, such that the photoresist material is cured to approach a wet film state and increase the adhesion of the photoresist material to the substrate.

In an exemplary structure of an oven, a lateral plate of the oven is provided with an access port and an access door configured to open and close the access port. During manufacturing, the access door is opened firstly, the substrate coated with the photoresist material is placed into the oven, then the access door is closed and the photoresist material on the substrate is baked. In the baking process, the solvent volatilized from the photoresist material easily forms a condensate and is then attached to the oven and the access door. After the baking is completed, the access door is opened by a worker, and the substrate is taken out of the oven via the access port. In such circumstance, the action of opening the access door would easily cause the condensate attached to the inner side surface of the access door to flow and drop downwards, particularly, when the substrate passes the access port, the condensate may easily drop onto the substrate, which may result in the contaminant of the substrate and the photoresist material, thereby affecting the subsequent production.

BRIEF SUMMARY OF THE INVENTION

It is an object of the present application to provide a baking device, which aims at solving the technical problem that the condensate easily drops onto the baked object when the baked object is taken out of the oven.

In order to achieve the above object, the application adopts the following technical solution: a baking device, comprises a body. The body has an access port, through which a baked object is allowed to be placed into or taken out of the body. An access door is mounted at the body and configured to open and close the access port. An inner side surface of the access door defines therein grooves configured to receive condensate.

In one embodiment, the access door is in connection with a pipeline, and the pipeline is in communication with the groove.

In one embodiment, the inner side surface of the access door is depressed into depressions. The depressions each have a channel, and each of the grooves is arranged at a bottom of the respective channel. The respective channel has a guide surface, and the guide surface extends from the respective groove towards a top of the access door.

In one embodiment, the guide surface extends towards an inner cavity of the body in an oblique direction, from the groove to the top of the access door.

In one embodiment, an angle between the oblique direction of the guide surface and a plumb line is between 3° and 5°

In one embodiment, the body comprises: a cover plate, a bottom plate configured to support the baked object, and side plates located between the cover plate and the bottom plate. The cover plate, the bottom plate, and the side plates are enclosed to form a baking chamber having the access port.

In one embodiment, the access door is slidably mounted at the body in a direction perpendicular to the bottom plate.

In one embodiment, the access door comprises a plurality of shutters in sequential connection with one another along a sliding direction of the access door. The respective depression is formed each of the shutters.

In one embodiment, two ends of the access door in the sliding direction thereof are respectively in fixed connection with a first sealing gasket and a second sealing gasket. The body comprises: a first abutting surface configured to abut against the first sealing gasket, and a second abutting surface configured to abut against the second sealing gasket.

In one embodiment, an upper end of the shutter arranged at an uppermost portion of the access door is provided with a rib, which protrudes from the inner side surface of the access door. The first sealing gasket is fixed at a lower surface of the rib. The second sealing gasket is fixed at a surface of a lower end of the shutter arranged at a lowermost portion of the access door.

In one embodiment, both the first sealing gasket and the second sealing gasket are made of a silicone pad.

In one embodiment, a heat plate is arranged on the bottom plate and configured for supporting and heating the baked object.

In one embodiment, the bottom plate defines therein a gas inlet in communication with the baking chamber, and the cover plate defines therein a gas outlet in communication with the baking chamber.

In one embodiment, a plurality of gas inlets are provided in the bottom plate, and the plurality of gas inlets are distributed in the bottom plate along a circumferential direction of the heat plate.

In one embodiment, a plurality of gas outlets are provided in the cover plate, and the plurality of gas outlets are distributed in the cover plate in the form of a rectangular array.

The present application further provides a baking device. The baking device comprises a body. The body has an access port, through which a baked object is allowed to be placed into or taken out of the body. An access door is mounted at the body and configured to open and close the access port. An inner side surface of the access door defines therein grooves configured to receive condensate.

The body comprises: a cover plate, a bottom plate configured to support the baked object, and side plates located between the cover plate and the bottom plate. The cover plate, the bottom plate, and the side plates are enclosed to form a baking chamber having the access port.

The inner side surface of the access door is depressed into depressions; the depressions each have a channel, and each of the grooves is arranged at a bottom of the respective channel. The respective channel has a guide surface, and the guide surface extends from the respective groove towards a top of the access door.

In one embodiment, a heat plate is arranged on the bottom plate and configured for supporting and heating the baked object. The bottom plate defines therein a plurality of gas inlets in communication with the baking chamber, and the plurality of gas inlets are distributed in the bottom plate along a circumferential direction of the heat plate. The cover plate defines therein a plurality of gas outlets in communication with the baking chamber, and the plurality of gas outlets are distributed in the cover plate in the form of a rectangular array.

In the baking device provided by the present application, by arranging the groove in the inner side surface of the access door to receive the condensate attached to the inner side surface of the access door, the condensate is not prone to drop onto the baked object when the baked object is taken out. By further arranging the depressions on the inner side surface of the access door, the resistance in the downward flowing of the condensate is reduced, which enables the condensate to drop into the groove more quickly. By arranging the gas inlet in the bottom plate and arranging the gas outlet in the cover plate, the gas flow field within the baking chamber is much stable, thereby further improving the baking effect.

BRIEF DESCRIPTION OF THE DRAWINGS

In order to more clearly illustrate the technical solution in embodiments of the present application, the following drawings, which are to be used in the description of the embodiments or the existing techniques, will be briefly described. It will be apparent that the drawings described in the following description are merely embodiments of the present application. Other drawings may be obtained by those skilled in the art without paying creative labor.

In the drawings, the following reference numerals are adopted:

1. Body; 11. First abutting surface; 12. Second abutting surface; 13. Cover plate; 131. Gas outlet; 14. Bottom plate; 141. Gas inlet; 15. Lateral plate; 16. Baking chamber; 2. Access door; 21. Shutter; 22. Depression; 221. Groove; 222. Guide surface; 23. Rib; 31. First sealing gasket; 32. Second sealing gasket; and 4. Heat plate.

DETAILED DESCRIPTION OF THE EMBODIMENTS

In order to make the technical problems to be solved, technical solutions, and beneficial effects of the present application more clear, the present application will be further described in detail hereinbelow with reference to the accompanying drawings and embodiments. It should be understood that the specific embodiments described herein are merely intended to explain the application rather than to limit the present application.

It should be noted that when an element is referred to as being "fixed" or "arranged" at/in/on another element, it can be directly at/in/on the other element. When an element is referred to as being "connected" to/with the another element, it can be directly or indirectly connected to/with the other element.

It should be understood that terms "length", "width", "upper", "lower", "front", "rear", "left", "right", "vertical", "horizontal", "top", "bottom", "inside", "outside" and the like indicating orientation or positional relationship are based on the orientation or the positional relationship shown in the drawings, and are merely for facilitating and simplifying the description of the present application, rather than indicating or implying that a device or component must have a particular orientation, or be configured or operated in a particular orientation, and thus should not be construed as limiting the application.

Moreover, the terms "first" and "second" are adopted for descriptive purposes only and are not to be construed as indicating or implying a relative importance or implicitly indicating the number of technical features indicated. Thus, features defining "first" and "second" may include one or more of the features either explicitly or implicitly. In the description of the present application, the meaning of "a plurality of" or "multiple" is two or more unless otherwise particularly defined.

Figure 1:
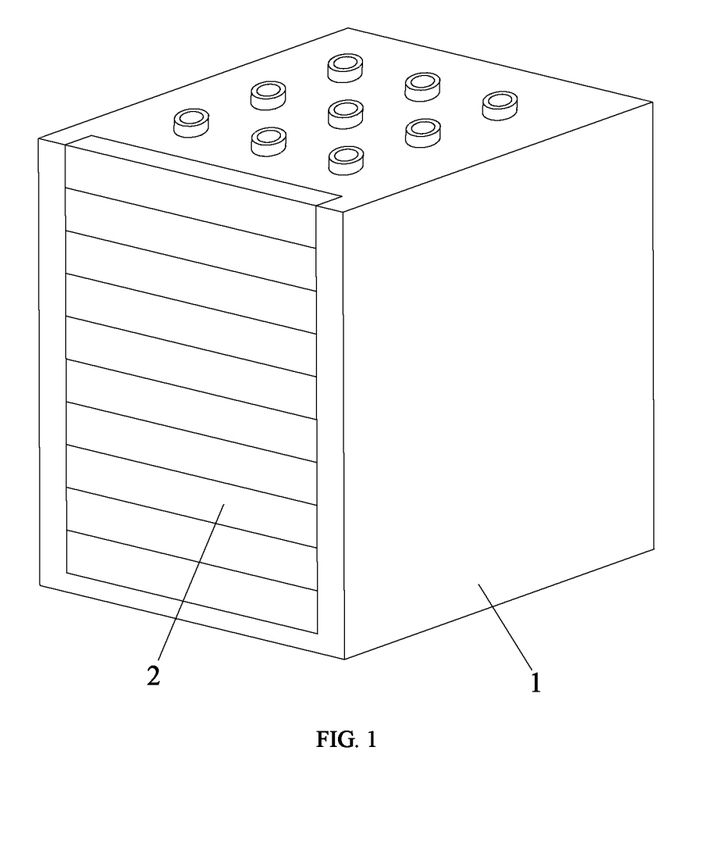
FIG. 1 is a structural schematic view of a baking device according to one embodiment of the present application.
Figure 2:
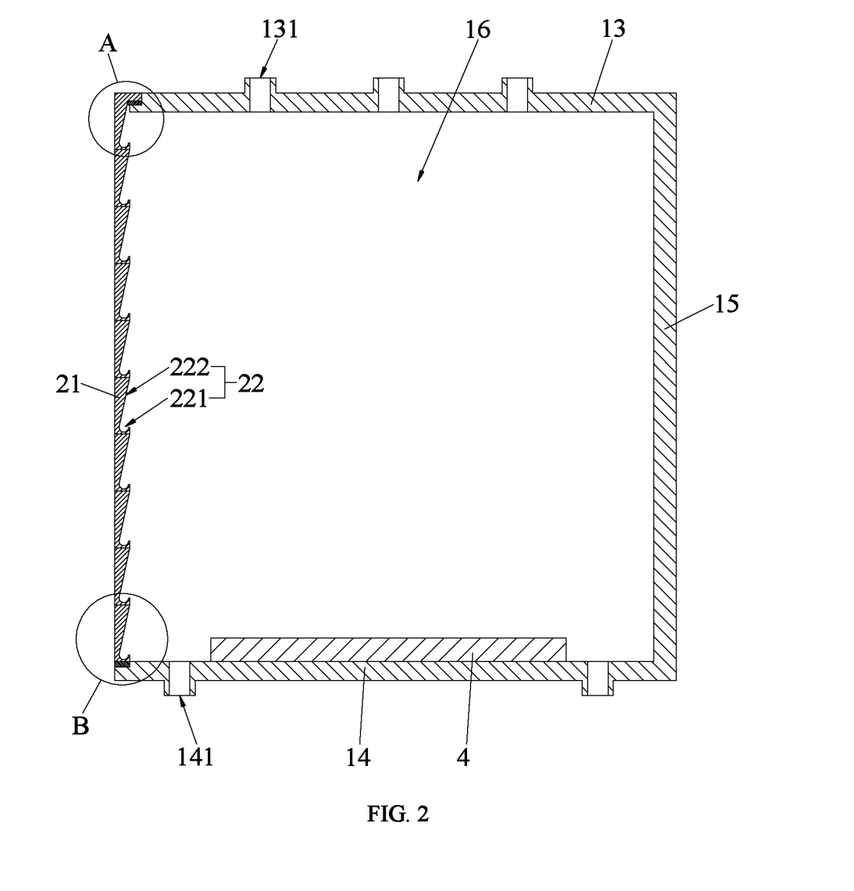
FIG. 2 is a cross sectional view of a baking device according to one embodiment of the present application.

The present embodiment provides a baking device, as shown in FIG. 1 and FIG. 2, comprising a body 1. A lateral side of the body 1 has an access port through which a baked object is allowed to be placed in or taken out. An access door 2 is mounted at the body 1 and configured to open and close the access port. An inner side surface of the access door 2 facing towards the body 1 (that is, a surface of the access door 2 facing an inner cavity of the body 1 when the access door 2 is closed) defines therein grooves 221 configured to receive condensate.

During the baking process, a volatile substance of the baked object volatilizes to form a condensate which is attached to the inner side surface of the access door 2, and flows downward along the inner side surface of the access door 2 into the groove 221 in the inner side surface of the access door 2 under the action of the gravity. In particular, after the baking is completed, the action of opening the access door 2 is not easy to cause the condensate attached to the inner side surface of the access door 2 to drop onto the baked object when the baked object passes through the access port, thereby avoiding the baked object from being contaminated by the condensate and ensuring the baking quality.

In one embodiment, the access door 2 is connected with a pipeline (not shown in the figures) communicating with the groove 221, such that the condensate received in the groove 221 can be discharged in time, and there is no need to dismount the access door 2 to frequently clean the condensate on the inner side surface of the access door 2 and in the groove 2.

Figure 3:
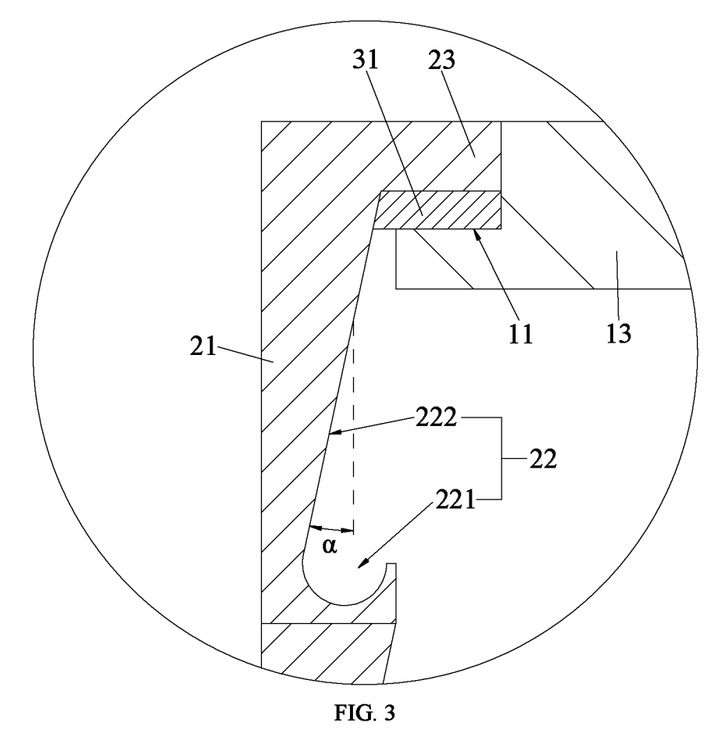
FIG. 3 is an enlarged view taken from part A of FIG. 2.

In particular, combining with FIG. 3, the inner side surface of the access door 2 is depressed into depressions 22. The depressions 22 each have a channel, and each of the grooves is arranged at a bottom of the respective channel. The respective channel has a guide surface 222, a lower end of the guide surface 222 is connected with the respective groove 221, and the guide surface 222 extends from the respective groove towards a top of the access door 2, such that the condensate attached to the inner side surface of the access door 2 can flow into the respective groove 221 of the guide surface 222.

In one embodiment, the guide surface 222 extends towards an inner cavity of the body in an oblique direction 1, from the groove 221 to the top of the access door 2, that is, the guide surface 222, from bottom to top, extends towards the inner cavity of the body 1 in an oblique direction, such that the resistance in the downward flowing of the condensate along the guide surface 222 is reduced, and the condensate can fall into the groove more quickly. Optionally, an angle (i.e., an angle α in FIG. 3) between the oblique direction of the guide surface 222 and a plumb line (that is the direction of the gravity) is between 3° and 5°. The angle within the above range can not only prevent the condensate from sudden drop caused by insufficient attachment during the downward flowing thereof along the guide surface 222, but also reduce the resistance in the downward flowing of the condensate along the guide surface 222.

Particularly, as shown in FIG. 1 and FIG. 2, the body 1 has a cover plate 13, a bottom plate 14, and side plates 15. The bottom plate 14 is located at a bottom of the body 1 and configured to support the baked object. The cover plate 13 is disposed opposite the bottom plate 14 and above the bottom plate 14. Three side plates 15 are provided and are respectively connected between the cover plate 13 and the bottom plate 14. The cover plate 13, the bottom plate 14, and the three side plates 15 are enclosed to form a baking chamber 16 with the access port, the structure of which is simpler.

In one embodiment, the access door 2 is slidably mounted at the body 1 in a direction perpendicular to the bottom plate 14, and the access door 2 may be slid upwards to open the access port and slid downwards to close the access port. The access door 2 may be connected to a drive mechanism, configured to drive the access door 2 to slide upwards and downwards to respectively open and close the access port. In addition, the groove 221 defined in the inner side surface of the access door 2 are capable of receiving the condensate, and the pipeline is capable of discharging the condensate received in the groove 221, such that the mechanical vibration produced in the sliding of the access door 2 under the drive of the drive mechanism will not easily cause the dropping of the condensate onto the baked objects. The drive mechanism may adopt a cylinder or a linear motor, etc., which enables a computer to control the action of the drive mechanism via a program to drive the access door 2 to slide, thereby automatically opening and closing the access port and realizing the automatic production. In other embodiments, the access door 2 may also be mounted at the body 1 in a manner of hinge connection, and the access door 2 may be rotated upwards to open the access port and rotated downwards to close the access port by the drive mechanism.

The specific structure of the access door 2 comprises a plurality of shutters 21 in fixed connection with one another, and the plurality of shutters 21 are sequentially arranged along the sliding direction of the access door 2 (i.e., a direction perpendicular to the bottom plate 14 or a vertical direction). Each of the shutters 21 has the depression 22 as described in the above. By designing the structure of the access door 2 as the plurality of shutters 21, the depressions 22 are spacedly arranged with a certain interval on the inner side surface of the access door 2 along the sliding direction of the access door 2, the condensate can be received by and discharged out of the grooves after flowing for a certain distance. Especially when the inner side surface of the access door 2 has a relatively large area, most part of condensate attached to the inner side surface of the access door 2 can be received by and discharged out of grooves, which further ensuring that the condensate is not prone to either be attached to the inner side surface of the access door or drop downwards.

Figure 4:
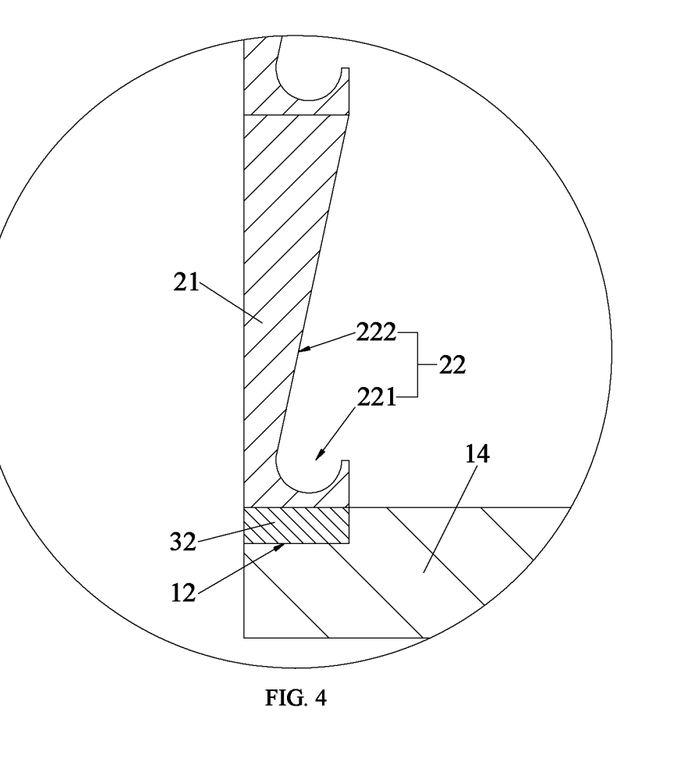
FIG. 4 is an enlarged view taken from part B of FIG. 2.

As shown in FIGS. 2 to 4, two ends of the access door 2 in the sliding direction thereof are respectively in fixed connection with a first sealing gasket 31 and a second sealing gasket 32. In the meanwhile, the body 1 has a first abutting surface 11 and a second abutting surface 12. When the access door 2 closes the access port, the first sealing gasket 31 on the access door 2 cooperates with the first abutting surface 11 of the body 1 in a manner of abut connection, and the second sealing gasket 32 on the access door 2 cooperates with the second abutting surface 12 of the body 1 in the manner of abut connection, in this way, a gap between the access door 2 and the body 1 is sealed, and the gas leakage and the heat loss in the body are therefore reduced. The first abutting surface 11 is formed on the cover plate 13, and the second abutting surface 12 is formed on the bottom plate 14. When the access door 2 closes the access port, the first sealing gasket 31 on the access door 2 abuts against the first abutting surface 11 on the cover plate 13, and the second sealing gasket 32 on the access door 2 abuts against the second abutting surface 12 on the bottom plate 14.

Particularly, as shown in FIG. 2 and FIG. 3, an upper end of the shutter 21 arranged at an uppermost portion of the access door 2 is integrally formed with a rib 23, which protrudes from the inner side surface of the access door 2. The first sealing gasket 31 is attached to a lower surface of the rib 23. When the access door 2 closes the access port, the first sealing gasket 31 is elastically pressed against the first abutting surface 11 of the cover plate 13. As shown in FIG. 2 and FIG. 4, the second sealing gasket 32 is attached to a surface of a lower end of the shutter 21 which is located at a lowermost portion of the access door 2. When the access door 2 closes the access port, the second sealing gasket is elastically pressed against the second abutting surface 12 of the bottom plate 14. Both the first sealing gasket 31 and the second sealing gasket 32 may be made of a silicone pad, which has better elasticity and thermal stability and obvious sealing effect, and can damp the vibration generated in the collision with the access door 2 when the access door 2 is slid to close the access port.

In one embodiment, the bottom plate 14 defines therein a gas inlet 141, the cover plate 13 defines therein a gas outlet 131, and the gas inlet 141 and the gas outlet 131 are respectively in communication with the baking chamber 16. In use, the gas inlet 141 of the bottom plate 14 and the gas outlet 131 of the cover plate 13 may be respectively connected with air pipes, and airflow is introduced via the gas inlet 141 of the bottom plate 14, flows within the baking chamber 16, and is then discharged out via the gas outlet 131 of the cover plate 13. Since the baked object is supported on the bottom plate 14, and the gas inlet 141 is defined in the bottom plate 14, the airflow introduced via the gas inlet 141 of the bottom plate 14 flows towards the gas outlet 131 of the cover plate 13, rather than flowing towards the baked object. In this way, the gas flow generated in the evaporation of the liquid from the baked object doesn't tend to directly interacts with the airflow introduced from the gas inlet 141, the formation of a turbulent gas flow filed in the baking chamber 16 above the baked object is avoided, thus the gas flow field is much stable and therefore beneficial for improving the baking effect. Moreover, the flowing of the gas follow within the baking chamber 16 is capable of carrying away most of the volatile substances from the baked object, which further reduces the condensate attached to the inner walls of body 1.

In one embodiment, a heat plate 4 is fixedly mounted at the bottom plate 14 and configured for supporting and heating the baked object, and the heat plate 4 is disposed inside the body 1 (i.e., the baking chamber 16). During the baking, the baked object is placed on the heat plate 4, and the heat plate 4 is enabled to heat the baked object. By combining with the gas flow inside the baking chamber, the baking speed is improved, the baked object is dried by removing the liquid therefrom, and most volatile substances are carried away from the baked object. In other embodiments, heated airflow may also be directly introduced into the baking chamber 16 via the gas inlet of the bottom plate 14, flow in the baking chamber 16, and be discharged out via the gas outlet of the cover plate 13, such that the temperature in the baking chamber 16 increases, the liquid in the baked object is removed, and most of the volatile substances are carried away from the baked object.

Optionally, the number of the gas inlet 141 in the bottom plate 14 is plural, and a plurality of gas inlets 141 are distributed in the bottom plate 14 along a circumferential direction of the heat plate 4, so that the plurality of gas inlets 141 in the bottom plate 14 surround the heat plate 4, and it is ensured that the airflow introduced into the baking chamber 16 via the gas inlets 141 will not flow to the baked object placed on the heat plate 4 and that the airflow flows into the baking chamber 16 more uniformly, the gas flow field within the baking chamber 16 is much stable, which further improves the baking effect. Optionally, the cover plate 13 may also adopts a plurality of gas outlets 131, and the plurality of gas outlets 131 are distributed in the cover plate 12 in the form of a rectangular array, which enables the gas flow flowing into the baking chamber 16 to be quickly discharged out via multiple positions on the cover plate 13.

In the baking device provided by the present application, by arranging the groove in the inner side surface of the access door to receive the condensate attached to the inner side surface of the access door, the condensate is not prone to drop onto the baked object when the baked object is taken out. By further arranging the depressions on the inner side surface of the access door, the resistance in the downward flowing of the condensate is reduced, which enables the condensate to drop into the groove more quickly. By arranging the gas inlet in the bottom plate and arranging the gas outlet in the cover plate, the gas flow field within the baking chamber is much stable, thereby further improving the baking effect.

The above description is only optional embodiments of the present application, and is not intended to limit the present application. Any modifications, equivalent substitutions, and improvements made within the spirit and principles of the present application are included in the protection scope of the present application.

What is claimed is:

1. A baking device, comprising a body, wherein the body has an access port, through which a baked object is allowed to be placed into or taken out of the body; an access door is mounted at the body and configured to open and close the access port; and an inner side surface of the access door defines therein a plurality of successively arranged arc grooves configured to receive condensate, wherein the inner side surface of the access door is depressed into depressions; the depressions each have a channel, and each of grooves is arranged at a bottom of a respective channel; and the respective channel has a guide surface, and the guide surface extends from a respective groove towards a top of the access door, wherein the guide surface extends towards an inner cavity of the body in an oblique direction, from the groove to the top of the access door.

2. The baking device of claim 1, wherein the access door is in connection with a pipeline, and the pipeline is in communication with the groove.

3. The baking device of claim 1, wherein an angle between a oblique direction of the guide surface and a plumb line is between 3° and 5°.

4. The baking device of claim 1, wherein the body comprises: a cover plate, a bottom plate configured to support the baked object, and side plates located between the cover plate and the bottom plate; and the cover plate, the bottom plate, and the side plates are enclosed to form a baking chamber having the access port.

5. The baking device of claim 4, wherein the access door is slidably mounted at the body in a direction perpendicular to the bottom plate.

6. The baking device of claim 5, wherein the access door comprises a plurality of shutters in sequential connection with one another along a sliding direction of the access door; and a respective depression is formed each of the shutters.

7. The baking device of claim 6, wherein two ends of the access door in the sliding direction thereof are respectively in fixed connection with a first sealing gasket and a second sealing gasket; and the body comprises: a first abutting surface configured to abut against the first sealing gasket, and a second abutting surface configured to abut against the second sealing gasket.

8. The baking device of claim 7, wherein an upper end of the shutter arranged at an uppermost portion of the access door is provided with a rib, which protrudes from the inner side surface of the access door; the first sealing gasket is fixed at a lower surface of the rib; and the second sealing gasket is fixed at a surface of a lower end of a shutter arranged at a lowermost portion of the access door.

9. The baking device of claim 7, wherein both the first sealing gasket and the second sealing gasket are made of a silicone pad.

10. The baking device of claim 4, wherein a heat plate is arranged on the bottom plate and configured for supporting and heating the baked object.

11. The baking device of claim 10, wherein the bottom plate defines therein a gas inlet in communication with the baking chamber, and the cover plate defines therein a gas outlet in communication with the baking chamber.

12. The baking device of claim 11, wherein a plurality of gas inlets are provided in the bottom plate, and the plurality of gas inlets are distributed in the bottom plate along a circumferential direction of the heat plate.

13. The baking device of claim 11, wherein a plurality of gas outlets are provided in the cover plate, and the plurality of gas outlets are distributed in the cover plate in the form of a rectangular array.

14. A baking device, comprising a body, wherein the body has an access port, through which a baked object is allowed to be placed into or taken out of the body; an access door is mounted at the body and configured to open and close the access port; and an inner side surface of the access door defines therein a plurality of successively arranged arc grooves configured to receive condensate;

the body comprises: a cover plate, a bottom plate configured to support the baked object, and side plates located between the cover plate and the bottom plate; the cover plate, the bottom plate, and the side plates are enclosed to form a baking chamber having the access port; and
the inner side surface of the access door is depressed into depressions; the depressions each have a channel, and each of the grooves is arranged at a bottom of the respective channel; and a respective channel has a guide surface, and the guide surface extends from a respective groove towards a top of the access door.

15. The baking device of claim 14, wherein a heat plate is arranged on the bottom plate and configured for supporting and heating the baked object; the bottom plate defines therein a plurality of gas inlets in communication with the baking chamber, and the plurality of gas inlets are distributed in the bottom plate along a circumferential direction of the heat plate; and the cover plate defines therein a plurality of gas outlets in communication with the baking chamber, and the plurality of gas outlets are distributed in the cover plate in the form of a rectangular array.

16. The baking device of claim 1, wherein the grooves are successively arranged on one inner sidewall along a vertical direction, an arrangement direction of the grooves is parallel with the sidewall.

17. The baking device of claim 1, wherein the grooves are spaced from each other along a vertical direction.

18. The baking device of claim 14, wherein the grooves are successively arranged on one inner sidewall along a vertical direction, an arrangement direction of the grooves is parallel with the sidewall.

19. The baking device of claim 14, wherein the grooves are spaced from each other along a vertical direction.

* * * * *